(12) United States Patent
Koorneef et al.

(10) Patent No.: US 7,183,674 B2
(45) Date of Patent: Feb. 27, 2007

(54) HERMETICALLY SEALED ELEMENTS OF AN ACTUATOR

(75) Inventors: Lucas Koorneef, Eindhoven (NL); Joroen van Aert, Eindhoven (NL); Frans van Deuren, Valkenswaard (NL); Sanders Broers, Eindhoven (NL)

(73) Assignee: Carl Zeiss SMT AG, Oberkochen (DE)

( * ) Notice: Subject to any disclaimer, the term of this patent is extended or adjusted under 35 U.S.C. 154(b) by 66 days.

(21) Appl. No.: 10/704,534

(22) Filed: Nov. 6, 2003

(65) Prior Publication Data
US 2005/0099069 A1    May 12, 2005

(51) Int. Cl.
*H02K 41/00*    (2006.01)

(52) U.S. Cl. ........................................................ 310/12
(58) Field of Classification Search ............... 310/12; 355/53, 72; 356/401, 498, 500
See application file for complete search history.

(56) References Cited

U.S. PATENT DOCUMENTS

| | | | |
|---|---|---|---|
| 3,610,876 A * | 10/1971 | Bhat | 219/137 R |
| 3,797,452 A * | 3/1974 | Dobson | 118/730 |
| 5,105,932 A * | 4/1992 | Bryson et al. | 198/619 |
| 5,323,012 A * | 6/1994 | Auslander et al. | 250/492.2 |
| 5,563,415 A * | 10/1996 | Crewe | 250/396 ML |
| 5,718,154 A * | 2/1998 | Council, Jr. | 82/1.11 |
| 6,147,818 A * | 11/2000 | Hale et al. | 359/819 |
| 6,231,732 B1 * | 5/2001 | Hollars et al. | 204/298.26 |
| 6,657,204 B2 * | 12/2003 | Buis et al. | 250/398 |
| 6,859,337 B2 * | 2/2005 | Oshino et al. | 359/819 |
| 6,995,484 B1 * | 2/2006 | Heimann et al. | 310/45 |

* cited by examiner

*Primary Examiner*—Thanh Lam
(74) *Attorney, Agent, or Firm*—Darby & Darby

(57) ABSTRACT

An actuator for positioning of an optical element, such as a mirror, in an optic system that operates under vacuum conditions is provided and includes a first actuator body including a first actuator element that is hermetically sealed in the first actuator body and a second actuator body that includes a second actuator element that is hermetically sealed in the second actuator body. The first and second actuator bodies are hermetically sealed using any number of techniques including a welding process. Moreover, in one embodiment, the actuator operates under the Lorentz principle and the first actuator element is a magnet or magnet assembly and the second actuator element is a coil assembly with the first and second actuator bodies being free of attachment to one another.

38 Claims, 3 Drawing Sheets

HERMETICALLY SEALED ELEMENTS OF AN ACTUATOR

TECHNICAL FIELD

The present invention relates to actuator assemblies and more particularly, to an assembly and method for vacuum sealing certain constituents of an optical element actuator that is used to position optical elements, such as mirrors, that are a part of an optic system, such as a projection optic box (POB) or the like.

BACKGROUND

In the manufacture of semiconductor devices, photolithography is often used. In a typical arrangement, a projection optics box (POB) contains the optical elements that are used to reduce the image and form it on a photosensitive substrate (wafer). Typically, the POB includes an arrangement of one or more mirrors and one or more lenses that are constructed and positioned to accomplish the intended result.

Occasionally, actuators are provided for acting upon the optical elements. One type of actuator that is used in a POB optic system is a Lorentz actuator. One of the issues that has to be confronted when using such actuators is that the actuators typically have a coil and magnet construction and in vacuum applications, such as within the POB, the coil, as well as the magnet, can have a large outgassing rate due to material properties and/or the design of the actuators. Outgassing occurs when a material is placed into a vacuum (very low atmospheric pressure) environment, subjected to heat, and some of the material's constituents are volatilized (evaporated or "outgassed"). As is known, different materials exhibit outgassing characteristics, including outgassing rates, when these materials are exposed to the above described conditions. The magnet can be made out of a material with some porosity which in effect acts as a sponge in a vacuum and the windings of the coil are made out of round copper wire with insulation disposed therearound. Because of the arrangement of the windings, there is always space, containing air, between the windings. Moreover, if the coil would be encapsulated only with a plastic, the results would not be satisfactory due to the outgassing properties of plastics.

The actuator is thus required to operate in ultra high vacuum (UHV) and therefore, in the case of a Lorentz actuator, the coil and magnet thereof must be shielded from vacuum in such a way that they meet the outgassing specification. If the outgassing is not controlled or mitigated in such a UHV lithography system, outgases will render the UHV lithography system useless in a very short time.

What has heretofore not been available is an improved shield assembly and method of shielding the magnet and coil of an actuator, e.g., a Lorentz actuator, that is to be used in an UHV lithography system.

SUMMARY

An actuator for positioning optical elements, such as a mirror, in an optic system that operates under vacuum conditions is provided and generally includes a first actuator body having a first actuator element and a second actuator body having a second actuator element. According to the present invention, each of the first and second actuator elements is encapsulated in its respective actuator body in a vacuum tight environment. In other words, each of the actuator bodies has a vacuum tight compartment or space that contains one of the actuator elements in a hermetically sealed manner so that the actuator element does not exhibit outgassing during a vacuum application.

The actuator can be a non-contact type actuator, such as a Lorentz actuator, or it can be another type of actuator, such as a piezo actuator. However, in both instances, the outgassing constituents of the actuator elements are hermetically sealed so as to eliminate or substantially reduce the problem of outgassing in a vacuum environment. The actuator bodies can be movable relative to one another or one can be fixed and the other can be movable or even both can be fixed in some manner.

In one exemplary embodiment, the actuator is a Lorentz type actuator and it includes a magnet assembly including at least one magnet that is encapsulated in a hermetically sealed manner by a plurality of members that surround the at least one magnet. The plurality of members are coupled to one another along joined interfaces so as to vacuum seal the at least one magnet. There are a number of different techniques that can be used to produce hermetically sealed edges/interfaces. For example, a welding process, such as laser welding or tungsten inert gas welding, can be used to hermetically seal the element in the respective actuator body. The actuator also has a coil assembly that includes a coil that is encapsulated in a hermetically sealed manner by a plurality of members that surround the coil and are coupled to one another along joined interfaces so as to vacuum seal the coil. The magnet and coil assemblies are preferably positioned such that the encapsulated coil is proximate the encapsulated magnet and the assemblies are free of attachment to one another.

The present actuator overcomes the deficiencies associated with the prior art by providing a construction which can be used in a vacuum application by creating a vacuum compatible encapsulation for the outgassing constituents.

Further aspects and features of the exemplary actuator and method of manufacture thereof can be appreciated from the appended Figures and accompanying written description.

BRIEF DESCRIPTION OF THE DRAWING FIGURES

DETAILED DESCRIPTION OF PREFERRED EMBODIMENTS

Figure 1:
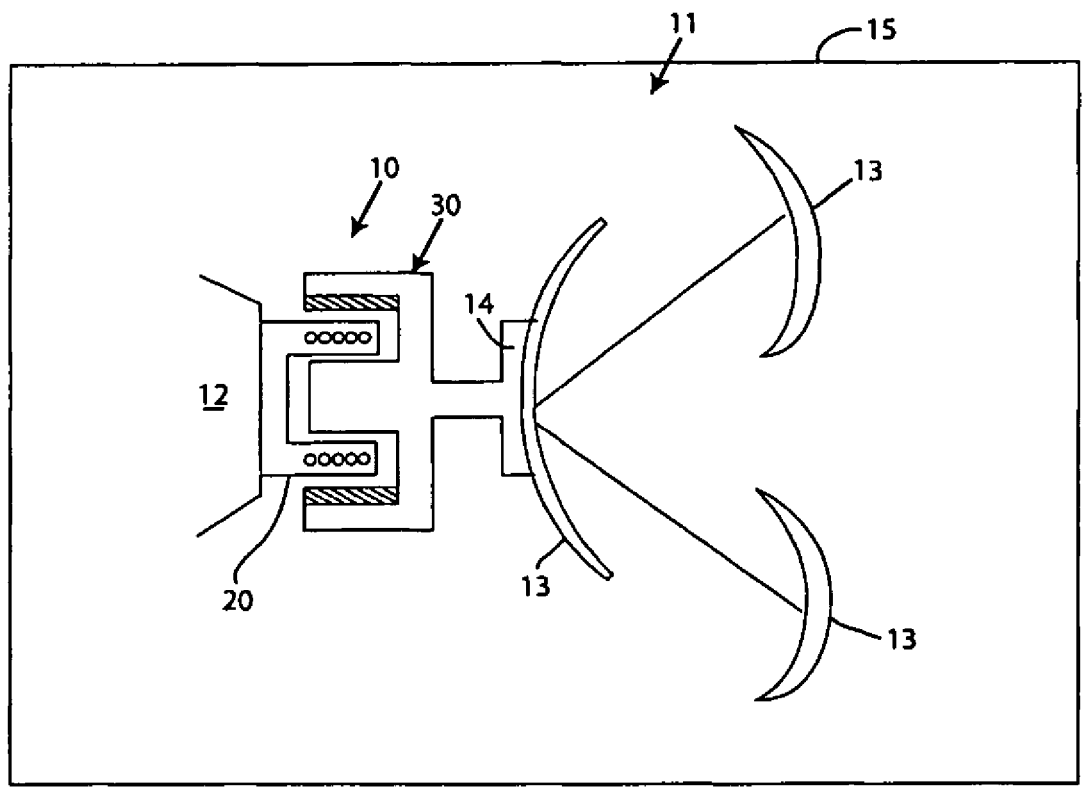
FIG. 1 is a side elevation view, in partial cross-section, of a section of one exemplary optic system including a plurality of mirrors.

FIG. 1 illustrates an actuator 10 according to a first embodiment for positioning an optical element within an optic system 11, such as a projection optic box (POB), that includes a plurality of mirrors 13 that are arranged in a predetermined sequence to produce a desired light path. The actuator 10 is constructed and designed so that it can act upon an optical element, such as one mirror 13, to permit minor adjustments to be made with respect to the position of the mirror 13 within the optic system 11 and relative to the other mirrors 13. The actuator 10 and mirrors 13 along with the other components are sealed within a vacuum chamber, generally indicated at 15.

The exemplary actuator 10 includes a first actuator body 20 and a second actuator body 30 that can be moved independent from one another. In the exemplary embodiment, the first actuator body 20 is illustrated as being attached to a first member 12 and the second actuator body 30 is illustrated as being attached to a second member 14 to permit the actuator 10 to selectively move one of the members 12, 14 relative to the other of the members 12, 14. In the embodiment of FIG. 1, the first member 12 is an actuator base and the second member 14 is coupled to one mirror 13.

Each of the first and second actuator bodies 20, 30 are constructed so that they overcome the deficiencies mentioned above, namely outgassing of certain components of the actuator in a vacuum setting, e.g., UHV application. The first and second actuator bodies 20, 30 can be formed of a number of different individual parts; however, in each instance, there is a vacuum tight space (hermetically sealed space) or compartment formed in each body 20, 30 for containing an actuator element that otherwise would exhibit outgassing characteristics. For example, the first actuator body 20 has a first vacuum tight compartment 22 in which a first actuator element 24 is disposed in a hermetically sealed (vacuum tight) environment. The specific construction of the first body 20 is not critical so long as the first actuator element 24 is contained within a vacuum tight environment. To provide such a vacuum tight compartment 22, the individual parts of the first actuator body 20 that define the vacuum tight compartment 22 are hermetically sealed along their adjacent joined edges. In other words, the joined edges of the individual parts are joined using a technique that ensures that the first actuator element 24 is contained within a vacuum tight compartment 22. For example, the edges of the individual parts that surround the first actuator element 24 and define the compartment 22 can be joined to one another using any number of different welding processes that provide a vacuum seal between the joined parts. More specifically, the welding process can be a laser welding process or it can be a brazing, plating, or soldering process. In addition, other techniques can be used to provide vacuum sealing between the parts, such as vapor deposition of a thin metal layer followed by galvanic deposition of a material, e.g., nickel, electroplating, and any other type of process that can produce a hermetic seal between two components, such as two metal parts. Other processes include ion beam welding, TIG welding, MIG welding, electron beam welding, friction welding, optical attaching, induction welding, O-ring sealed, metal contact sealing, cold welding, foil sealing, CVD plating, and PVD plating.

Similarly, the second actuator body 30 has a second vacuum tight compartment 32 in which a second actuator element 34 is disposed in a hermetically sealed (vacuum tight) environment. The specific construction of the second body 30 is not critical so long as the second actuator element 34 is contained within a vacuum tight environment. To provide such a vacuum tight compartment 32, the individual parts of the second actuator body 30 that define the vacuum tight compartment 32 are hermetically sealed along their adjacent joined edges. As with the parts of the first actuator body 20, the individual parts of the second actuator body 30 are vacuum sealed along their joined edges so as to vacuum encapsulate the second actuator element 34. The same techniques that are listed above can be used to vacuum seal the edges of the parts of the second actuator body 30. It will be appreciated that the first and second elements 24, 34 are both elements that would exhibit outgassing if they were not contained in a vacuum tight environment and thus, the present invention can broadly be thought of as hermetically sealing of elements in an actuator to thereby eliminate or substantially reduce outgassing of these elements when placed in a vacuum setting, such as the one that is typically found in optic actuator environments. FIG. 1 generally illustrates a two part actuator 10 with first and second actuator elements 24, 34 being hermetically sealed in respective vacuum tight compartments.

In the illustrated embodiment and in the case where the actuator 10 uses Lorentz type forces for precision positioning, the first actuator element 24 comprises voice coils and the second actuator element 34 is a permanent magnet core assembly. More specifically, the vacuum tight compartment 22 of the first actuator body 20 houses the various parts of the coils 24, such as wires surrounded by insulating material 23, e.g., an organic insulator and the vacuum tight compartment 32 of the second actuator body 30 houses the permanent magnet 34. As with other types of Lorentz actuators, the permanent magnet is placed into close proximity with the voice coils such that upon activation thereof, the permanent magnet is permitted to a degree of travel relative to the voice coils resulting in the precise position of the mirror 13.

Figure 2:
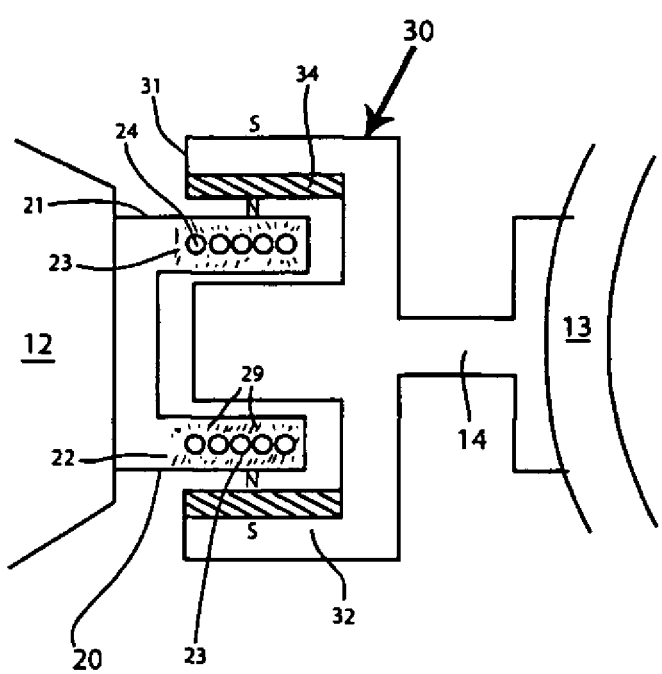
FIG. 2 is a cross-sectional view of one exemplary actuator according to a first embodiment for use in the optic system of FIG. 1.
Figure 3:
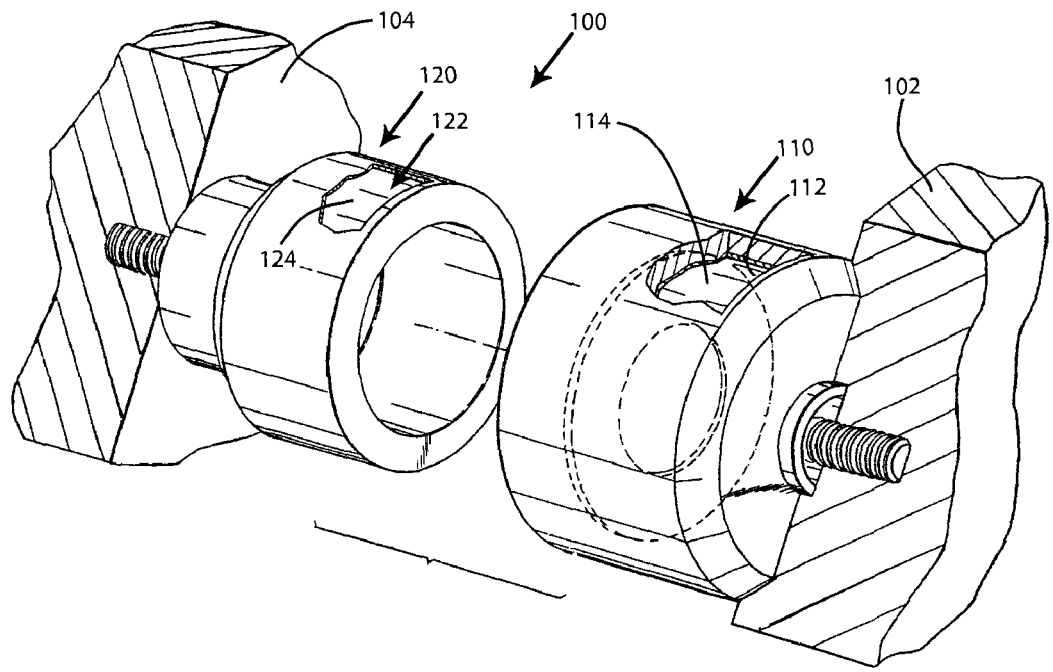
FIG. 3 is a perspective partially cut away view of an exemplary actuator in the form of a Lorentz type actuator for use in the optic system of FIG. 1.
Figure 4:
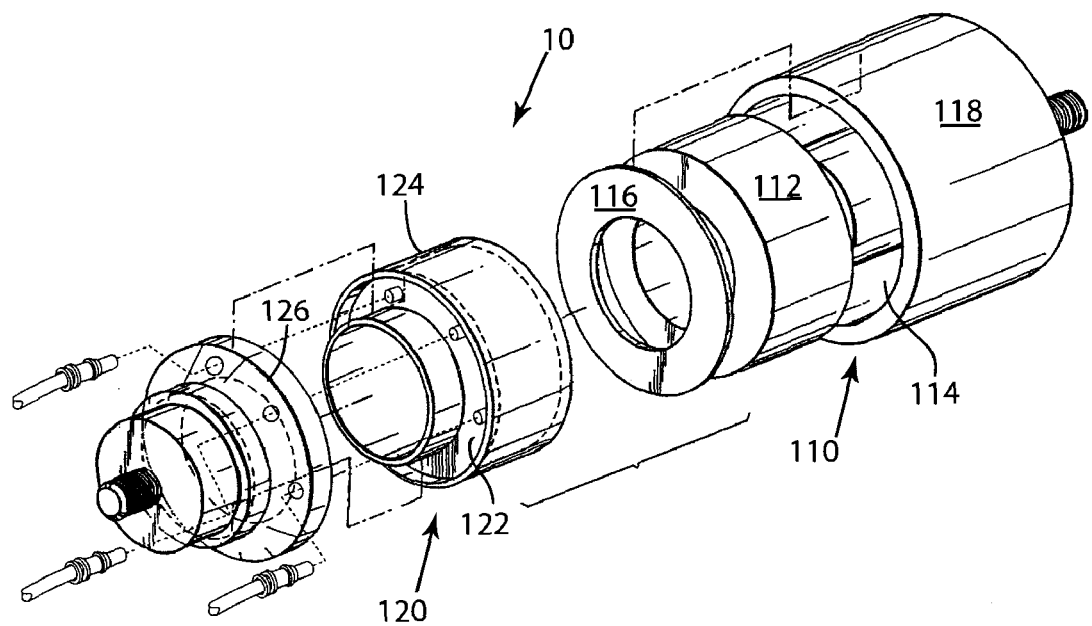
FIG. 4 is a perspective exploded view of the actuator of FIG. 1.

FIG. 2 shows the actuator 10 in greater detail, with the formation of residual gases being generally indicated at 29. It will be appreciated that the residual gases 29 are contained within the vacuum tight compartment 22 and therefore, this actuator element does not exhibit outgassing during a vacuum application, such as the one illustrated in FIG. 1. In FIGS. 1 and 2, the first actuator body 20 includes a housing 21 that defines the first vacuum compartment 22 and contains the first actuator element 24. Similarly, the second actuator body 30 includes a housing 31 that defines the second vacuum compartment 32 and contains the second actuator element 34. The housing 31 can be a hermetic metal enclosure that is welded or otherwise hermetically sealed along the interface between the housing 31 and the member 14, e.g., a base.

Now referring to FIG. 3–6, in which one exemplary actuator 100 is shown and includes a first actuator body 110 that is attached to a first member 102 and a second actuator body 120 that is attached to a second member 104. In one embodiment, the first member 102 is an actuator base and the second member 104 is attached to a reaction path that dissipates the reaction to the actuation forces. As with the actuator 10, the actuator 100 is constructed so that a first actuator element 112 associated with the first actuator body 110 is contained within a vacuum sealed compartment 114, while a second actuator element 122 associated with the second actuator body 120 is contained within a vacuum sealed compartment 124.

FIGS. 3–6 show one exemplary manner of vacuum sealing the first actuator element 112 within the first actuator body 110 by using a sealing member 116 which partially defines the vacuum tight compartment 114 and is vacuum sealed along its edges to a base 118 of the first actuator body 110. Similarly, the second actuator element 122 is shown in a vacuum sealed environment in which a base 126 of the second actuator body 120 serves to seal the second actuator element 122.

It will be appreciated that the specific shapes and dimensions of the individual parts of the first actuator body 110, including the first actuator element 112, and the specific shapes and dimensions of the individual parts of the second actuator body 120, including the second actuator element 122, are merely for purpose of illustration and are not limiting in any way.

In one embodiment, the actuator 100 is a non-contact actuator in that the first actuator body 110 is operatively positioned relative to the second actuator body 120; however, the first and second actuator bodies 110, 120 are not in physical contact with one another. One type of non-contact actuator 100 is a Lorentz actuator and in this embodiment, the first actuator body 110 is therefore a magnet assembly and the second actuator body 120 is a coil assembly. More specifically, the first actuator element 112 is formed of one or more magnets and the second actuator element 122 is a coil assembly.

Figure 5:
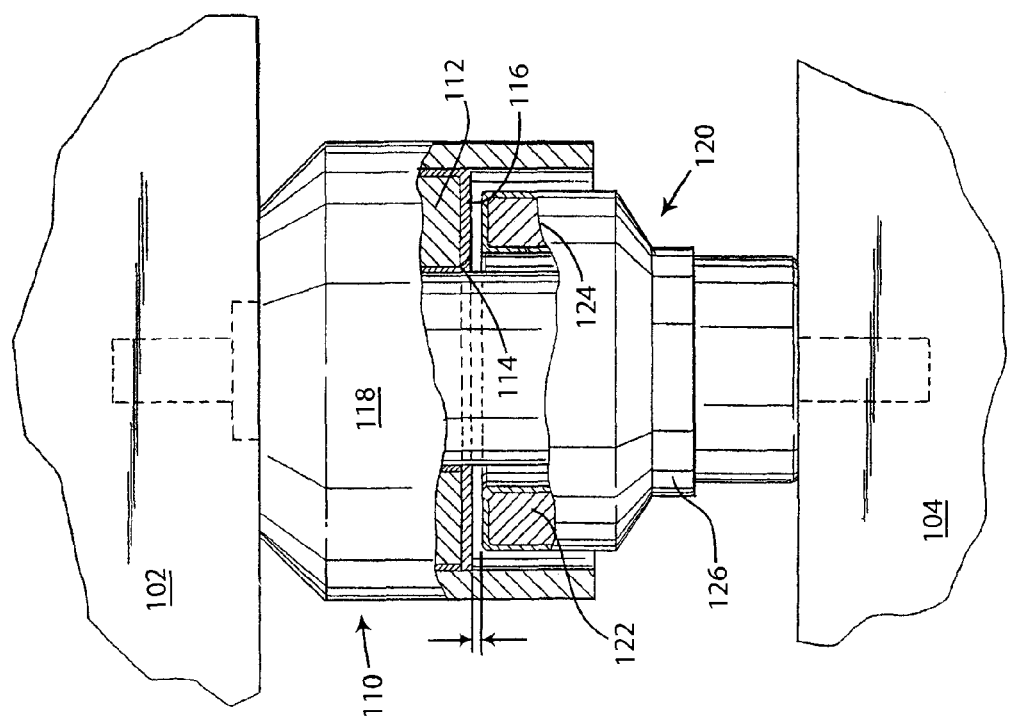
FIG. 5 is a perspective partially cut away view of two independent parts of the actuator in a first position.
Figure 6:
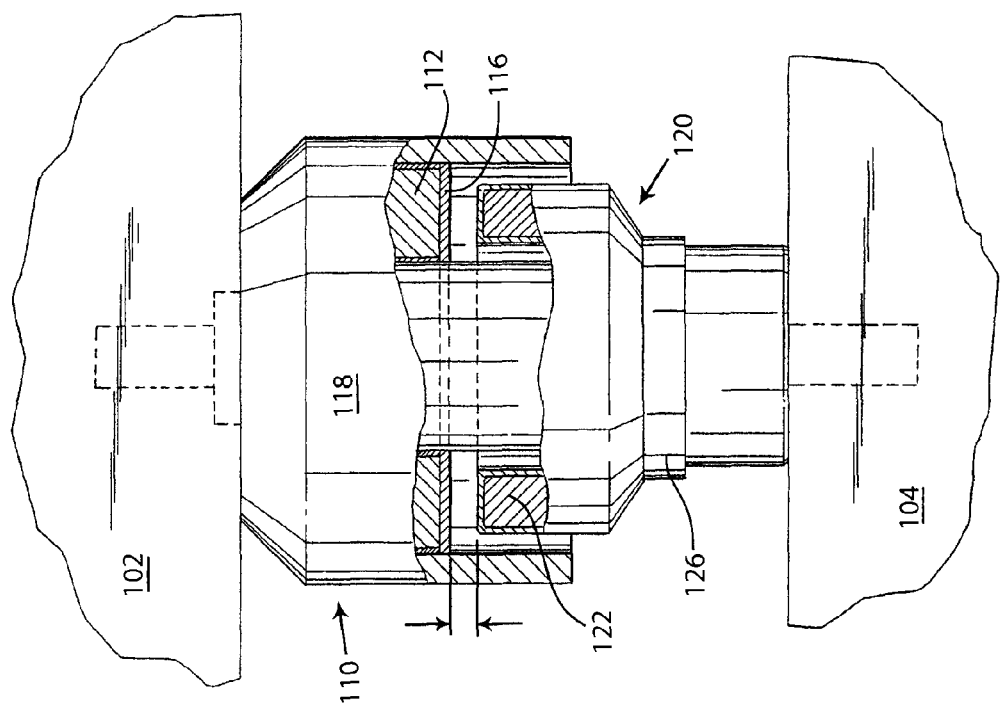
FIG. 6 is a perspective partially cut away view of the two independent actuator parts in a second position.

FIGS. 5 and 6 illustrate actuator 100 in two different positions and while, the actuator of FIGS. 5 and 6 will be described in terms of being an example of a non-contact actuator, such as a Lorentz actuator, it will be appreciated that the actuator 100 illustrated therein can be another type of actuator, such as a piezo actuator, etc. FIG. 5 illustrates the actuator 100 in a first position whereby the first and second actuator bodies 110, 120 are placed in a close proximate relationship to one another. More specifically, the second actuator body 120 remains free of physical contact with the first actuator body 110 but is disposed within the first actuator body 110. The vacuum sealing of both the first and second actuator elements 112, 122 can be seen in FIGS. 5 and 6. When actuator 100 is a Lorentz type actuator, the first actuator element 112 is a magnet, or magnet assembly, (known to have outgassing properties) and the second actuator element 122 is a coil assembly that is operatively connected to an electric source so that an electric current can be delivered to the coil assembly, and thereby change the magnetic flux of the actuator. As is known, this results in relative movement between the first and second actuator bodies 110, 120 and thus, the members 102, 104 to which these bodies 110, 120, respectively, are attached to are likewise moved relative to one another. In FIG. 5, the first and second actuator bodies 110, 120 are spaced a first distance from one another and in FIG. 6, the first and second actuator bodies 110, 120 are spaced a second distance from one another that is less than the first distance as a result of operation of the coil assembly 122. Since the exemplary illustrated actuator 100 is a non-contact actuator, the first and second actuator bodies 110, 120 do not physically contact one another during operation of the actuator but rather the position of the two bodies 110, 120 is adjustable. Typically in a Lorentz actuator, the first actuator body 110 containing the magnet element 112 is attached to an actuator base that is directly coupled to an optical element, such as a mirror, and the second actuator body 120 containing the coil assembly 122 is attached to a force path that dissipate any disturbance forces from the actuator to the rest of the optical assembly.

Not only can the actuator 100 be a non-contact actuator in which the first and second actuator bodies 110, 120 are free from physical contact with one another but the actuator 100 can also be another type of actuator, such as a piezo actuator or the like, etc. Thus, one actuator body can be fixed stationary, while the other actuator body is movable; or both actuator bodies can have some degree of movement with respect to one another. In all of these embodiments, the actuator is formed of two parts where one part contains an element that is hermetically sealed and the other part contains an element that is hermetically sealed. In some types of actuators, such as a Lorentz actuator, one actuator element is a passive element (magnet) while the other actuator element is an active element (coil assembly).

Accordingly, the Lorentz actuator 100 is formed of a magnet assembly and a coil assembly (voice coils) that both operatively cooperate with one another to provide an actuator that acts to move and position the mirrors associated with the optic system. While one exemplary application for the actuator 100 is a projection lithographic application, it will be appreciated that the present invention is broadly thought of as relating to an actuator assembly for causing the relative movement of an object, such as a mirror. Thus, mirrors are merely one exemplary application; however, there are a vast number of other types of different applications in which the actuator 100 can be embodied.

The magnet assembly of actuator 100 is thus configured to overcome the deficiencies mentioned above, namely outgassing of the magnets in a vacuum setting, e.g., UHV application. The magnet assembly is formed of a number of individual parts that are assembled together to form the magnet assembly so that the magnets thereof are shielded from vacuum in the final assembly. In other words, the magnet assembly is constructed so that it provides vacuum sealing of the magnets that are provided as a part thereof. Preferably, the magnet assembly is contained in a magnet case that is formed of a non-magnetic material.

It will be appreciated that the present construction permits a relative "dirty" part (actuator magnets) to be used in vacuum applications (UHV applications) by creating a vacuum compatible lightweight and small volume encapsulation. The magnet components are hermetically sealed (vacuum sealed) since they are completely encapsulated by components that have been hermetically sealed along their joined edges where they interface with each other. After assembling the magnet assembly, the entire structure is subject to re-machining to meet geometric tolerances. As a result of the hermetical sealing of the magnet components, the magnet assembly meets outgassing specifications.

Similarly, the coil assembly is constructed of a number of different parts that are hermetically sealed. In one exemplary embodiment, the coil (voice coil) is modified to keep the coil position stable during its lifetime. For example, the coil can be injected molded with a plastic to form a more robust structure with improved life. The injected plastic is dispersed throughout the windings of the coil and when it cools, a solid, stable coil structure is formed.

The coil can be enclosed within a magnet case using a coil cover. The coil cover therefore also has a shape complementary to the case to permit reception of the cover between the inner surface of the case. The coil cover can be formed with a plurality of openings formed therethrough to provide communication pathways to the coil that is securely retained within the case. For example, the coil cover can have two openings formed therethrough to receive members that serve to seal conductive leads associated with the coil. More specifically, one grommet or the like is provided for each opening as well as a glass bead that seals the grommet within the opening when it is reflowed. The grommet is generally a tubular member with a through bore extending therethrough for receiving conductive leads as is described below.

In assembling the coil assembly, the grommets and the beads are inserted into respective openings formed in the coil cover. The grommets and the beads are heated until the glass beads melt and flow around the outer periphery of the grommets. After the beads cool down, the beads form gastight and electrically isolated connections between the grommets and the coil cover. This sealing action by the beads is important because the openings in which the grommets are disposed communicate directly with the coil that needs to be sealed from vacuum and therefore, the grommet/cover interface must promote the shielding of the coil. These combined parts form the coil cover assembly. The other parts are then positioned relative to another and intersecting edges thereof are hermetically sealed. The coil cover assembly is then assembled to the other components by disposing the cover between the case. In this position, there is a slight gap or space formed between the first face of the cover and the coil to permit reception of the grommet. The coil includes coil wires that act as conductive leads for the coil. These coil wires are each led through one grommet and come out of a side hole formed in the grommet. The coil cover is then securely attached to the coil case by one of the above described hermetic sealing techniques. By hermetic sealing the cover to the coil case, an airtight cylinder (vacuum tight chamber or compartment) is formed to house and contain the coil and importantly, this airtight cylinder meets outgassing specifications and therefore, the coil assembly can be used in vacuum applications, such as UHV applications.

In order to provide an electrical connection to the enclosed and shielded coil, connection wires or leads are provided and are connected to respective grommets. The grommet, coil (coil wires) and connection wire are then soldered together to provide an electrical connection between the coil and the connection wire. One will appreciate that during the intended use, the coil assembly is connected to a source of current so that a variable current is passed through the coil, thereby influencing and modifying the magnetic field between the coil and the magnets in the magnet assembly. The varying of the magnetic field results in the magnet assembly moving relative to the coil assembly. In other words, a repulsive force can be generated resulting in the magnet assembly moving further away from the coil assembly or an attractive force can be generated resulting in the magnet assembly moving toward the coil assembly.

The present actuator 100 overcomes the deficiencies associated with the prior art by providing a construction in the both the magnet and coil can be used in vacuum by creating a vacuum compatible lightweight and small volume encapsulation for each of these parts. Moreover, the technique of attaching the individual parts by a hermetic sealing process is also a feature that is not found in the conventional actuator assemblies and provides the desirable vacuum shielding properties. With respect to the coil assembly, the sealing of the grommets by glass beads combines a wire feed through and a UHV sealing and accordingly, these are features not found in the prior art. The present assemblies have been tested and have been found to pass the outgassing specifications due to the improved shielding of the magnet and the coil.

It will be appreciated by persons skilled in the art that the present invention is not limited to the embodiments described thus far with reference to the accompanying drawings; rather the present invention is limited only by the following claims.

What is claimed is:
1. An optical system with at least an optical surface and an actuator, the actuator comprising a first body that includes at least one active part that is disposed within a first vacuum sealed spaced formed in the first body and a second body including at least one passive part that is disposed within a second vacuum sealed space formed in the second body.

2. The optical system of claim 1, wherein the active part includes one of a permanent magnet and a magnet assembly and the passive part comprises a coil assembly.

3. The optical system of claim 1, wherein the active part and the passive part are free of physical contact with one another.

4. The optical system of claim 1, wherein the actuator functions according to the Lorentz principle.

5. The optical system of claim 1, wherein The first vacuum sealed space is defined by a plurality of first parts that are vacuum sealed along intersecting edges and the second vacuum sealed space is defined by a plurality of second parts that are vacuum sealed along intersecting edges.

6. The optical system of claim 5, wherein the vacuum sealed edges formed between the plurality of first parts and the plurality of second parts comprise welded edges.

7. The optical system of claim 6, wherein the welded edges are laser welded edges or tungsten inert gas welded edges.

8. An optical system with at least an optical surface and an actuator, the actuator comprising a constituent with a material with outgassing characteristics under vacuum, wherein the constituent is high vacuum tight sealed in an enclosure, thus preventing the optical surface from influence of the material, wherein the constituent is formed of a magnetic material, wherein the enclosure is an inorganic non-metallic cover that is selected from the group consisting of a glass cover and an encapsulation cover formed of an enamel.

9. The optical system of claim 8, wherein the optical system and the actuator are enclosed in a high or ultra high vacuum system.

10. The optical system of claim 8, wherein the constituent is an electric device comprising insulated wire.

11. The optical system of claim 8, wherein the enclosure is a metal container hermetically sealed by a technique selected from the group consisting of welding, brazing, soldering, plating and vapor deposition coating.

12. The optical system of claim 8, wherein the constituent with the material that exhibits outgassing characteristics comprises a body having some degree of porosity.

13. The optical system of claim 12, wherein the body comprises a permanent magnet.

14. An actuator for mirror actuation comprising:
a first body that includes at least one active part that is disposed within a first vacuum sealed space formed in the first body; and
a second body including at least one passive part that is disposed within a second vacuum sealed space formed in the second body.

15. The actuator of claim 14, wherein the active part includes one of a permanent magnet and a magnet assembly and the passive part comprises a coil assembly.

16. The actuator of claim 14, wherein the active part and the passive part are free of physical contact with one another.

17. The actuator of claim 14, wherein the actuator functions according to the Lorentz principle.

18. The actuator of claim 14, wherein the first vacuum sealed space is defined by a plurality of first parts that are vacuum sealed along intersecting edges and the second vacuum sealed space is defined by a plurality of second parts that are vacuum sealed along intersecting edges.

19. The actuator of claim 18, wherein the vacuum sealed edges formed between the plurality of first parts and the plurality of second parts comprise welded edges.

20. The actuator of claim 19, wherein the welded edges are laser welded edges or tungsten inert gas welded edges.

21. A Lorentz type actuator for positioning of an optical element in an optic system that operates under vacuum conditions, the actuator comprising:
   a magnet assembly including at least one magnet that is hermetically sealed within a first actuator body; and
   a coil assembly including a coil that is hermetically sealed within a second actuator body, wherein the assemblies are free of attachment to one another wherein the magnet assembly includes:
   a magnet core having a section for receiving a first magnet;
   a magnet case that has an interior cavity that receives the magnet core so that the magnet case completely surrounds the magnet core; and
   a magnet ring disposed between the magnet core and the magnet case so as to partition the interior cavity of the magnet case into a first interior section and a second interior section, wherein the magnet ring is coupled to the magnet case and the magnet core along hermetically sealed peripheral edges of the magnet ring.

22. The actuator of claim 21, wherein abutting edges of parts that make up the magnet assembly comprise hermetically sealed edges.

23. The actuator of claim 22, wherein the sealed edges are laser welded edges or tungsten inert gas welded edges.

24. The actuator of claim 21, wherein the coil assembly includes:
   a coil case;
   a coil support core which is coupled to one end of the coil case along a hermetically sealed peripheral edge thereof, the coil core and coil case defining a space for receiving the coil; and
   a coil cover for encapsulating the coil within the coil assembly, wherein the coil cover is coupled to coil case and coil core along hermetically sealed peripheral edges thereof.

25. The actuator of claim 24, wherein the coil case and a section of the coil core enclose a substantial surface area of the coil with the coil cover enclosing a remaining surface area of the coil.

26. The actuator of claim 24, wherein the coil cover includes a plurality of openings formed therethrough to provide communication with the coil.

27. The actuator of claim 26, wherein the coil assembly further includes:
   a plurality of grommets for providing an electrical connection to the coil, the grommets being received through the openings formed in the coil cover; and
   a plurality of glass beads for providing gastight and electric isolated connections between the grommets and the coil cover after heating the glass beads.

28. The actuator of claim 27, wherein the coil includes coil leads that are disposed through the grommets and connections wires are disposed into the grommets and the coil leads, grommets and connection wires are soldered together to provide an electrical connection for the coil and complete the vacuum closure of the coil.

29. The actuator of claim 24, wherein abutting edges of constituents of the coil assembly comprise hermetically sealed edges.

30. The actuator of claim 24, wherein the sealed edges are laser welded edges or tungsten inert gas welded edges.

31. A method of eliminating or significantly reducing outgassing of an actuator for positioning an optical element in an optic system that operates under vacuum or defined atmosphere conditions, wherein the actuator includes at least one first constituent formed of a permanent magnet that exhibits outgassing properties in a vacuum application, and wherein the actuator includes a second constituent in a second actuator body, the method comprising the steps of:
   hermetically sealing the at least one first constituent in a first actuator body and hermetically sealing the second constituent in the second actuator body.

32. The method of claim 31, wherein the actuator operates according to the Lorentz principle.

33. The method of claim 31, wherein each of the first and second actuator bodies includes a metal jacket that effectuates the hermetic sealing.

34. The method of claim 31, wherein the step of hermetically sealing the first constituent in the first actuator body comprises the step of:
   welding abutting edges of individual parts of the first actuator body so as to encapsulate the first constituent in a vacuum tight space.

35. The method of claims 34, wherein the step of welding is performed by a laser or by a tungsten inert gas welder.

36. The method of claim 31, wherein the step of hermetically sealing the second constituent in the second actuator body comprises the step of:
   welding abutting edges of individual parts of the second actuator body so as to encapsulate the second constituent in a vacuum tight space.

37. The method of claim 31, wherein the second actuator body is a coil assembly and the second constituent is a coil.

38. The method of claim 37, further including the step of:
   sealing cable exits of the coil with glass beads.

* * * * *

UNITED STATES PATENT AND TRADEMARK OFFICE
CERTIFICATE OF CORRECTION

| | | |
|---|---|---|
| PATENT NO. | : 7,183,674 B2 | Page 1 of 1 |
| APPLICATION NO. | : 10/704534 | |
| DATED | : February 27, 2007 | |
| INVENTOR(S) | : L. Koomeef et al. | |

It is certified that error appears in the above-identified patent and that said Letters Patent is hereby corrected as shown below:

On the Title page # 75 under Inventors:

Delete "Joroen" and insert --Jeroen--.

Delete "Sanders" and insert --Sander--.

Signed and Sealed this

Seventeenth Day of April, 2007

JON W. DUDAS
*Director of the United States Patent and Trademark Office*